US008801232B2

(12) United States Patent
Park

(10) Patent No.: US 8,801,232 B2
(45) Date of Patent: Aug. 12, 2014

(54) LIGHT EMITTING DEVICE PACKAGE AND DISPLAY DEVICE THEREWITH

(75) Inventor: Sang Jae Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 233 days.

(21) Appl. No.: 13/367,043

(22) Filed: Feb. 6, 2012

(65) Prior Publication Data

US 2012/0134178 A1 May 31, 2012

(30) Foreign Application Priority Data

Jun. 30, 2011 (KR) .......................... 10-2011-0064972

(51) Int. Cl.
*F21V 7/00* (2006.01)

(52) U.S. Cl.
USPC .................... 362/296.01; 362/97.1; 362/97.2; 362/341; 362/608; 362/609

(58) Field of Classification Search
USPC .......... 362/97.1, 97.2, 296.01, 297, 341, 608, 362/609; 257/88, 98–100
See application file for complete search history.

(56) References Cited

U.S. PATENT DOCUMENTS

2006/0125716 A1* 6/2006 Wong et al. ...................... 345/46
2011/0241028 A1* 10/2011 Park et al. ........................ 257/88

* cited by examiner

*Primary Examiner* — Meghan Dunwiddie
(74) *Attorney, Agent, or Firm* — KED & Associates LLP

(57) ABSTRACT

An embodiment discloses a light emitting device package including a first lead frame and a second lead frame disposed spaced from each other, a light emitting device disposed on the first lead frame, and a reflective sidewall disposed on the first lead frame and the second lead frame to surround the light emitting device, wherein a portion of the reflective sidewall has a height higher than the other portion of the reflective sidewall.

19 Claims, 11 Drawing Sheets

LIGHT EMITTING DEVICE PACKAGE AND DISPLAY DEVICE THEREWITH

CROSS REFERENCE TO RELATED APPLICATION

This application claims priority under 35 U.S.C §119 to Korean Patent Application No. 10-2011-0064972, filed in Korea on Jun. 30, 2011, which is hereby incorporated in its entirety by reference as if fully set forth herein.

TECHNICAL FIELD

Embodiments relate to a light emitting device package.

BACKGROUND

The light emitting device, such as a light emitting diode of III-V group or II-VI group compound semiconductor or a laser diode, can produce various colors, such as red, blue, and ultra-violet owing to development of the thin film growth technology and device materials therefor, as well as a white color of good efficiency by using a fluorescent material or mixing colors, and is advantageous in that the light emitting device has power consumption lower than the present light sources, such as a fluorescent light and an incandescent light, a semi-permanent lifetime, fast response speed, and safety, and is environment friendly.

Accordingly, application of the light emitting device is expanding even to transmission modules of optical communication means, a light emitting diode back light unit which is replacing CCFL (Cold Cathode Fluorescence Lamp) of the back light unit in an LCD (Liquid Crystal Display) device, white light emitting diode lighting devices, car head lights, and signal lamps.

A light emitting device package having the light emitting devices mounted in, and connected to, a package body is widely used in the lighting devices or the display devices.

SUMMARY

Embodiments provide a light emitting device package having an asymmetric light emitting angle.

In one embodiment, a light emitting device package includes a first lead frame and a second lead frame spaced from each other, a light emitting device disposed on the first lead frame, and a reflective sidewall disposed on the first lead frame and the second lead frame to surround the light emitting device, wherein a portion of the reflective sidewall has a different height from the other portion of the reflective sidewall. The reflective sidewall may have a protrusion from at least a portion of a region thereof.

The reflective sidewall may include a plurality of side walls, wherein at least one of the side walls may have at least one of a height or a slope angle different from the rest of the side walls.

The reflective sidewall may include a plurality of side walls, and a protrusion disposed on at least one of the side walls. The protrusion may be disposed on one of long side walls of the plurality of the side walls.

The protrusion may be disposed on one of the long side walls and on a portion of each of short side walls adjacent to the one long side wall of the plurality of the side walls. The protrusion may be formed as one unit with the reflective sidewall. The protrusion may be formed of a reflective material different from the reflective sidewall. The protrusion may have a height higher than the rest of the side walls. A first region is symmetry with a second region and the first region is one region of an upper side of the reflective sidewall that the protrusion is disposed on. The second region is the rest region of the upper side of the reflective sidewall except the first region.

The protrusion may be a light forwarding angle adjusting portion for adjusting a light forwarding angle according to a thickness and a slope angle thereof.

In another embodiment, a light emitting device package includes a first lead frame and a second lead frame spaced from each other, a light emitting device disposed on the first lead frame, and a reflective sidewall having a plurality of side walls disposed around the first lead frame and the second lead frame, wherein a spaced distance spaced apart from at least one of the side walls to the light emitting device is different from a spaced distance spaced from the rest of the side walls to the light emitting device.

One of the side walls may have a thickness the same with a thickness of the other one. One of the side walls may have a slope angle the same with the other one. One of the side walls may have a distance from an outside surface thereof to the light emitting device different from a distance from an outside surface of the other one of the side walls to the light emitting device.

One of the side walls may have a distance from an outside surface thereof to the light emitting device the same with a distance from an outside surface of the other one of the side walls to the light emitting device. One of the side walls has a thickness different from a thickness of the other one.

In another embodiment, a display device includes a bottom cover, a substrate and a light emitting module including a light emitting device package disposed on the substrate, a reflective plate disposed in front of the bottom cover, a light guide plate disposed in front of the reflective plate for guiding a light from the light emitting module, an optical member disposed in front of the light guide plate, and a liquid crystal display panel disposed in front of the optical member, wherein the light emitting device package includes a first lead frame and a second lead frame disposed spaced from each other, a light emitting device disposed on the first lead frame, and a reflective sidewall disposed on the first lead frame and the second lead frame to surround the light emitting device, wherein a portion of the reflective sidewall has a different height from the other portion of the reflective sidewall. The protrusion is disposed on the substrate parallel to an incident surface of the light guide plate.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
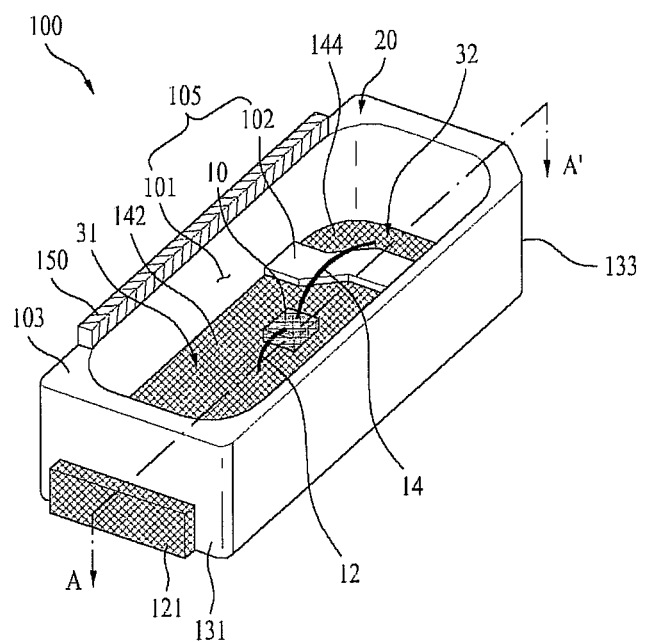
FIG. 1 illustrates a perspective view of a light emitting device package in accordance with one embodiment, seen from above.

Hereinafter, embodiments will be described with reference to the annexed drawings. In description of embodiments, if it is described that a layer (a film), a region, a pattern, or a structure is formed "on" or "under" a substrate, a layer (a film), a region, a pad, or a pattern, the "on", or "under" implies that the layer (the film), the region, the pattern, or the structure is formed "on" or "under" the substrate, the layer (the film), the region, the pad, or the pattern directly or indirectly with other substrate, layer (film), region, pad, or pattern, disposed therebetween. And, a reference on the "on" or "under" is the drawing.

A size shown in a drawing is exaggerated, omitted or shown schematically for convenience or clarity of description. And, the size of an element may not be shown to scale, perfectly. Wherever possible, the same reference numbers will be used throughout the drawings to refer to the same or like parts. A light emitting device package, a lighting device therewith, and a display device therewith will be described with reference to the attached drawings.

Figure 2:
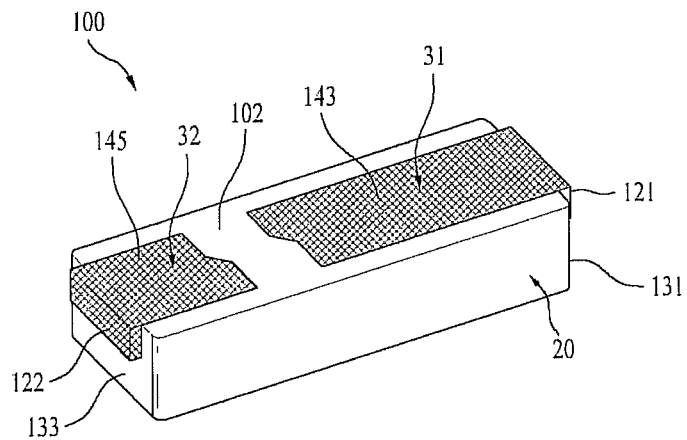
FIG. 2 illustrates a perspective view of the light emitting device package in FIG. 1, seen from below.
Figure 3:
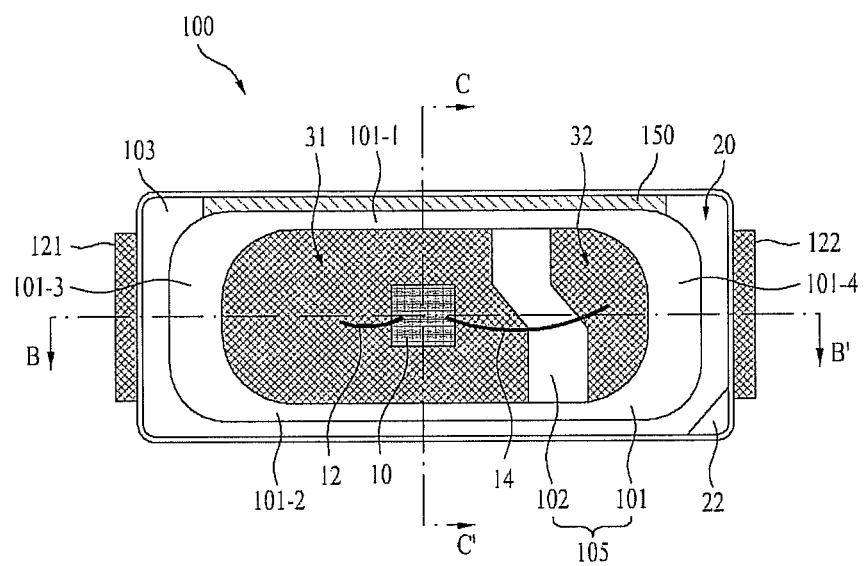
FIG. 3 illustrates a plan view of the light emitting device package in FIG. 1.
Figure 4:
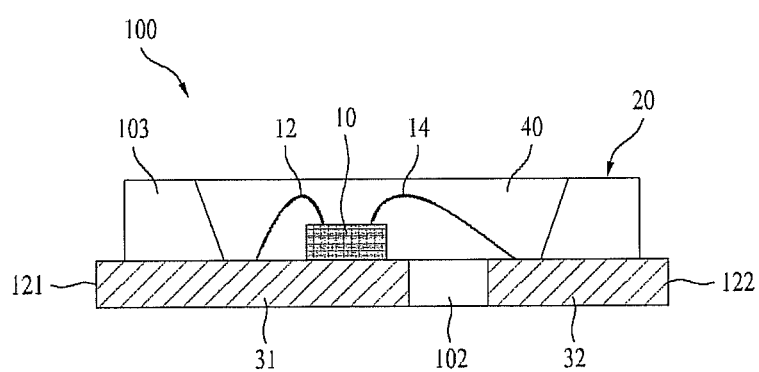
FIG. 4 illustrates a section of the light emitting device package in FIG. 1 across a line A-A'.
Figure 5:
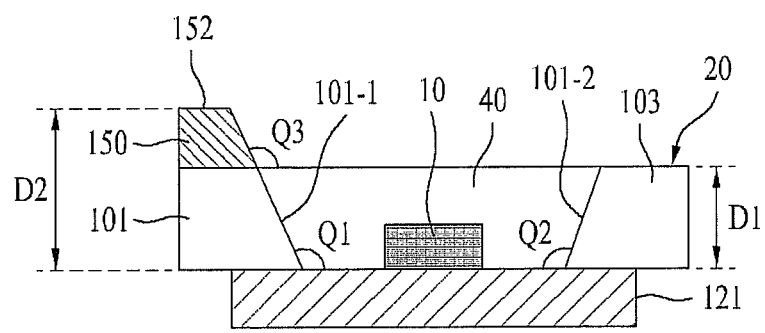
FIG. 5 illustrates a section of the light emitting device package in FIG. 1 across a line B-B'.

FIG. 1 illustrates a perspective view of a light emitting device package 100 in accordance with one embodiment, seen from above, FIG. 2 illustrates a perspective view of the light emitting device package 100 in FIG. 1, seen from below, FIG. 3 illustrates a plan view of the light emitting device package 100 in FIG. 1, FIG. 4 illustrates a section of the light emitting device package 100 in FIG. 1 across a line A-A', and FIG. 5 illustrates a section of the light emitting device package 100 in FIG. 1 across a line B-B'.

Referring to FIGS. 1 to 5, the light emitting device package 100 includes a body 20, a first lead frame 31, a second lead frame 32, a light emitting device 10, a first wire 12, a second wire 14, a resin layer 40, and a protrusion 150.

The body 20 may be formed of a resin, such as PPA (Polyphthalamide), ceramic, or silicon Si.

The body 20 may have different shapes of an upper side, such as triangular, rectangular, polygonal, and circular shapes, depending on usage and design of the light emitting device package 100. For an example, the rectangular light emitting device package 100 shown in the drawing may be used in an edge type backlight unit BLU, and, if it is intended to apply the body 20 to a portable flash light, or a domestic lighting, the body 20 may be varied with sizes and shapes so as to be built in a portable flash light, or a domestic lighting.

The body 20 may have a cavity 105 with an opened upper side, a reflective sidewall 101, and a bottom 102. The cavity 105 may have a cup shape, or a recessed container shape, and the reflective sidewall 101 of the cavity 105 may be vertical or sloped to the bottom 102. The reflective sidewall 101 may surround outsides of the bottom 102, the first lead frame, and the second lead frame. The reflective sidewall 101 can reflect a light incident thereon from the light emitting device 10 to be described later.

Or, the body 20 may include the reflective sidewall 101 around the first lead frame 31 and the second lead frame 32, or extended upward to surround the outside circumference thereof. For example, the upward may be vertical to the bottom 102 of the body 20.

The cavity 105 may have a circular, rectangular, polygonal, or oval shape if the cavity 105 is seen from above. For an example, as shown in FIG. 1, though the cavity 105 may have a rectangular shape with curved corners, the shape of the cavity 105 is not limited to this.

The first lead frame 31 and the second lead frame 32 disposed on the body 20 are electrically isolated from each other. For an example, the bottom 102 of the cavity 105 may be located between the first lead frame 31 and the second lead frame 32.

Referring to FIG. 2, the first lead frame 31 may have one end 121 passed through one side 131 of the body, and exposed to an outside, the second lead frame 32 may have one end 122 passed through the other side 132 of the body, and exposed to an outside. And, the first lead frame 31 may have a backside 143 exposed from the body 20, and the second lead frame 32 may have a backside 145 exposed from the body 20.

Since the first lead frame 31 and the second lead frame 32 have the one ends 121, and 122, and the backsides 143, and 145 exposed from the body 20 respectively, heat from the light emitting device 10 disposed at the first lead frame 31 can be dissipated to the outside of the body 20 through the first lead frame 31. The reflective sidewall 101 may be disposed on the first lead frame 31 and the second lead frame 32 to extend upward therefrom.

Though FIGS. 1 to 5 illustrate the first lead frame 31 having a length longer than a length of the second lead frame 32, in another embodiment, the second lead frame 32 may have a length longer than, or the same with, a length of the first lead frame 31.

The light emitting device 10 may be mounted on the first lead frame 31 and connected to the first lead frame 31 and the second lead frame 32, electrically. The light emitting device 10 may have, but not limited to, for an example, LED (Light Emitting Diode) which emits a red, green, blue, or white color, or a UV (Ultra Violet) diode which emits a UV beam.

As shown, the light emitting device 10 may be connected to the first lead frame 31 and the second lead frame 32 by wire bonding, electrically.

The first wire 12 may connect the light emitting device 10 and the first lead frame 31 electrically, and the second wire 14 may connect the light emitting device 10 and the second lead frame 32, electrically. However, in other embodiments, the light emitting device 10 may be connected to the first lead frame 31 and the second lead frame 32 by flip chip, die bonding, and so on, electrically.

The first lead frame 31 and the second lead frame 32 may be single or multiple layers of a conductive material, such as metal, for an example, one selected from Ti, Cu, Ni, Au, Cr, Ta, Pt, Sn, Ag, and P, or an alloy thereof.

The protrusion 150 is an upward projection from a region of the upper side 103 of the body 20. As shown in FIG. 5, the protrusion 150 may be a projection from a region of the reflective sidewall 101 of the body 20. In the embodiment, the protrusion 150 may be a reflective member of a material different from the reflective sidewall 101 or the body 20.

The reflective sidewall 101 includes a plurality of sidewalls 101-1~101-4, and the protrusion 150 may be disposed at least one of the plurality of sidewalls 101-1~101-4.

For an example, the protrusion 150 may be disposed one of opposite sidewalls (For an example, 101-1 and 101-2). For an example, the reflective sidewall 101 may include long side walls and short side walls, and the protrusion 150 may be disposed on one of the long side walls (For an example, 101-1). The long side wall is a side wall having a length longer than the short side wall.

Since the protrusion 150 is also formed of the reflective member and disposed around the light emitting device 10, the protrusion 150 may reflect the light incident thereon from the light emitting device 10.

At least one of the side walls may have at least one of a height, or a slope angle different from the rest of the side walls. For example, a height of at least one of the side walls may be different from that of the rest of the side walls, and/or a slope angle of at least one of the side walls may be different from that of the rest of the side walls.

The height of the protrusion 150 may be higher than that of the rest of the side walls.

A height D2 from the first lead frame 31 or the second lead frame 32 to the top side 152 of the protrusion 150 is higher than a height D1 from the first lead frame 31 or the second lead frame 32 to the upper side of the reflective sidewall 101.

A first angle $\theta 1$ may be the same with a second angle $\theta 2$. The first angle $\theta 1$ may be a slope angle of the first side wall 101-1 from the first lead frame 31. The second angle $\theta 2$ may be a slope angle of the second side wall 101-2 from the first lead frame 31. And, a third angle $\theta 3$ may be the same with the first angle $\theta 1$, but the embodiment is not limited to this, and may be $\theta 3 \neq \theta 1$. The third angle $\theta 3$ may be a slope angle of the protrusion 150 from the first lead frame 31. And, the slope angle of the first side wall 101-1 may be different from a slope angle of the rest of the side walls 101-2~101-4. For an example, the slope angle of the first side wall 101-1 may be different from the slope angle of the second side wall 101-2.

The embodiment may have an asymmetric light forwarding angle owing to the asymmetric reflective sidewall 101. For an example, the embodiment may reduce the light forwarding angle owing to the asymmetric reflective sidewall 101.

Since the protrusion 150 causes the asymmetric reflective sidewall 101 that surrounds the light emitting device 10, the light emitting device package 100 of the embodiment may have the asymmetric light forwarding angle which may be adjusted by adjusting a thickness or the slope angle of the protrusion 150.

Referring to FIG. 5, the resin layer 40 may be filled in the cavity 105 of the body 20, i.e., the reflective sidewall 101 for enclosing and protecting the light emitting device 10. The resin layer 40 may be formed of silicon or resin. The resin layer 40 may be formed by, but not limited to, filling and setting the silicon or the resin in the cavity 105.

The resin layer 40 filled in the reflective sidewall 101 may have an upper side positioned below the upper side 152 of the protrusion 150.

The resin layer 40 may include a fluorescent material to excite the light from the light emitting device 10 to produce other color. For an example, if the light emitting device 10 is a blue light emitting diode, and the fluorescent material has a yellow color, the yellow fluorescent material is excited by the blue color light to produce a white color light. If the light emitting device 10 emits a UV beam, R, G, B three color fluorescent materials added to the light emitting device 10 can produce a white color light.

The light emitting device package 100 may further comprise a lens (Not shown) on the resin layer 40. A distribution of the light from the light emitting device package 100 may be adjusted by the lens. And, The light emitting device package 100 may further comprise a Zener diode (not shown). The zener diode may be mounted to the body 20 for improving a withstand voltage, additionally. In this instance, the light emitting device 10 may be mounted to one of the first lead frame 31 and second lead frame 32, and the Zener diode may be mounted to the other one.

Figure 6:
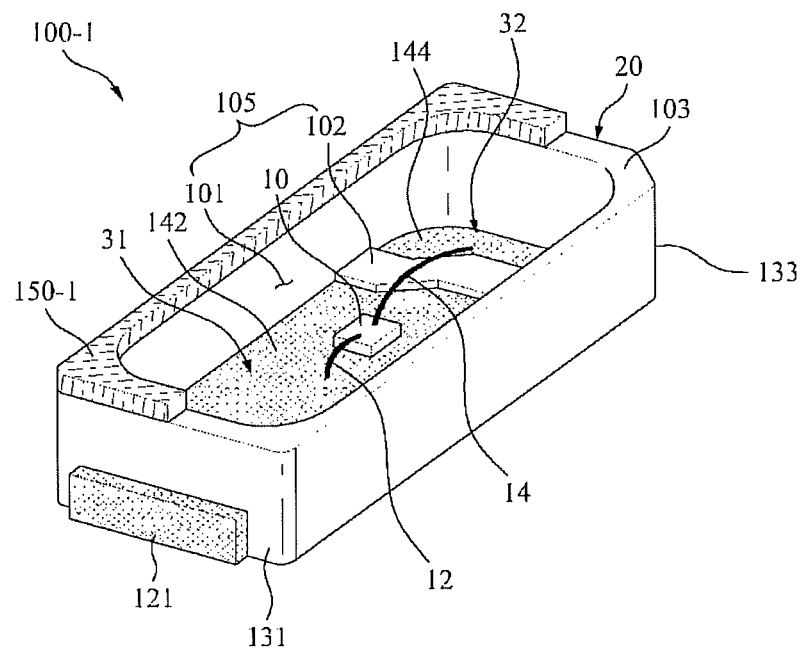
FIG. 6 illustrates a perspective view of a light emitting device package in accordance with another embodiment, seen from above.

FIG. 6 illustrates a perspective view of a light emitting device package in accordance with another embodiment, seen from above. As shown in FIG. 6, the protrusion 150-1 may be disposed on one of the long side walls and a portion of each of the short side walls adjacent to the one of the long side walls. The protrusion 150-1 may be formed of a reflective member of a material different from the reflective sidewall 101 or the body 20.

In detail, the protrusion 150-1 may be disposed on the upper side of one of the long side walls and extended to the upper side of each of the short side walls adjacent to the upper side of one of the long side walls. A first region of the upper side 103 of the reflective sidewall 101 having the protrusion 150-1 may be symmetric with a second region of the upper side of the reflective sidewall 101 having no protrusion 150-1. For example, the second region may be the rest region of the upper side of the reflective sidewall 101 except the first region. The first region may be symmetric with the second region in the left and right directions.

Figure 7:
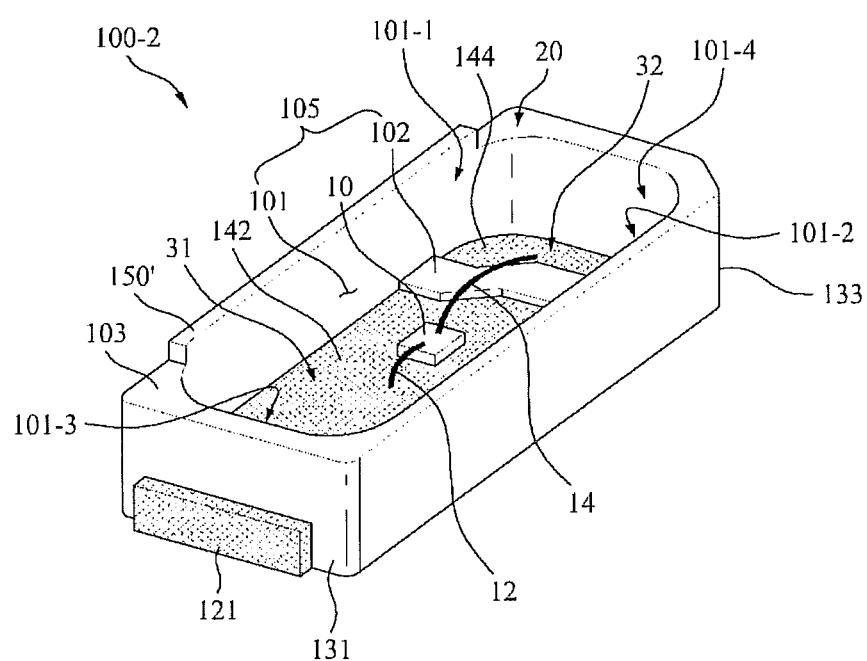
FIG. 7 illustrates a perspective view of a variation the light emitting device package in FIG. 1.

FIG. 7 illustrates a perspective view of a variation the light emitting device package in FIG. 1. As shown in FIG. 7, the light emitting device package 100-2 includes a first lead frame 31 and a second lead frame 32 disposed spaced from each other, a reflective sidewall 101 disposed on the first lead frame 31 and the second lead frame 32 to surround the light emitting device 10, wherein a portion of the reflective sidewall 101 has a height different from the other portion thereof.

The reflective sidewall 101 has a protrusion 150' with at least a region thereof projected therefrom, formed of a material the same with the body 20 or the reflective sidewall 101, or as one unit with the reflective sidewall 101.

If the protrusion 150' is formed of a material the same with the reflective sidewall 101 as one unit therewith, the protrusion 150' may be a portion of the reflective sidewall 101.

The body 20 includes the reflective sidewall 101 having a plurality of side walls 101-1~101-4 which surround the light emitting device 10. One pair of opposite side walls (For an example, 101-1 and 101-2) may have at least one of heights or slope angles different from each other, or may be asymmetric.

One 101-1 of the side walls of the reflective sidewall 101 may have a height different from other side walls 101-2~101-4. For an example, the height of the first side wall 101-1 of the reflective sidewall 101 may be higher than the height of the second side wall 101-2. The first side wall 101-1 and the second side wall 101-2 may be opposite side walls, and the long side walls.

The embodiment may have an asymmetric light forwarding angle owing to the asymmetric reflective sidewall 101.

For an example, the embodiment may adjust a light forwarding angle by the asymmetric reflective sidewall 101.

Figure 8:
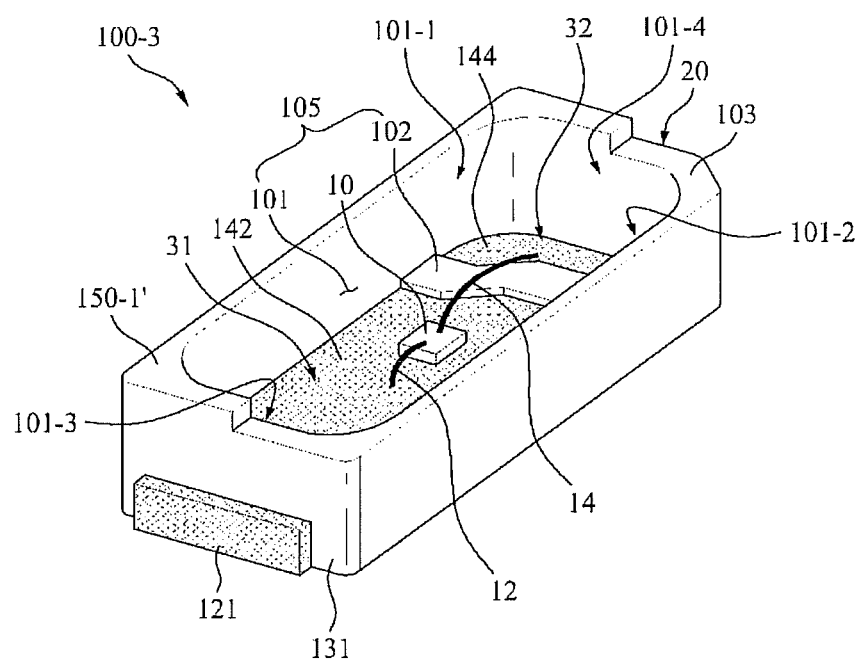
FIG. 8 illustrates a perspective view of a variation of the light emitting device package in FIG. 6, seen from above.

FIG. 8 illustrates a perspective view of a variation 100-3 of the light emitting device package in FIG. 6, seen from above. As shown in FIG. 8, a protrusion 150'-1 may have a shape identical to the protrusion 150-1 in FIG. 6. However, the protrusion 150'-1 may be formed of a material identical to the body 20 or the reflective sidewall 101, or formed as one unit with the reflective sidewall 101. If the protrusion 150'-1 is formed of a material identical to, and as one unit with, the reflective sidewall 101, the protrusion 150'-1 may be a portion of the reflective sidewall 101.

Figure 9:
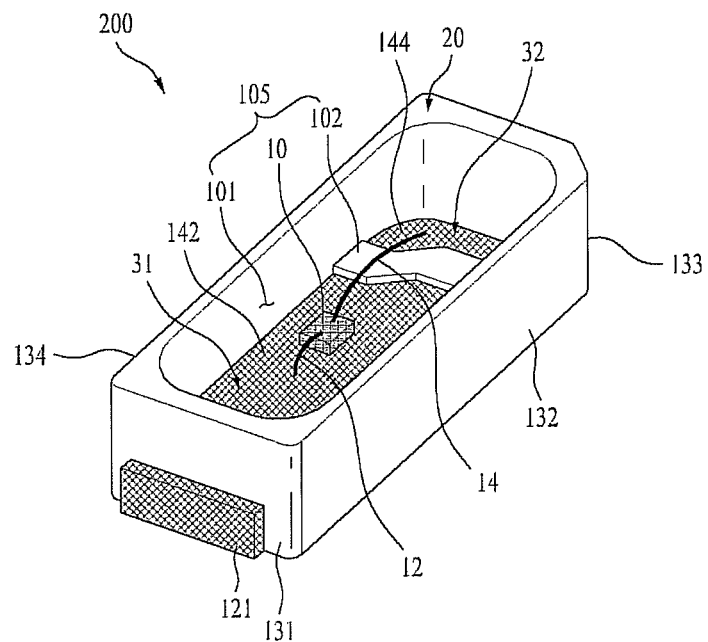
FIG. 9 illustrates a perspective view of a light emitting device package in accordance with another embodiment, seen from above.
Figure 10:
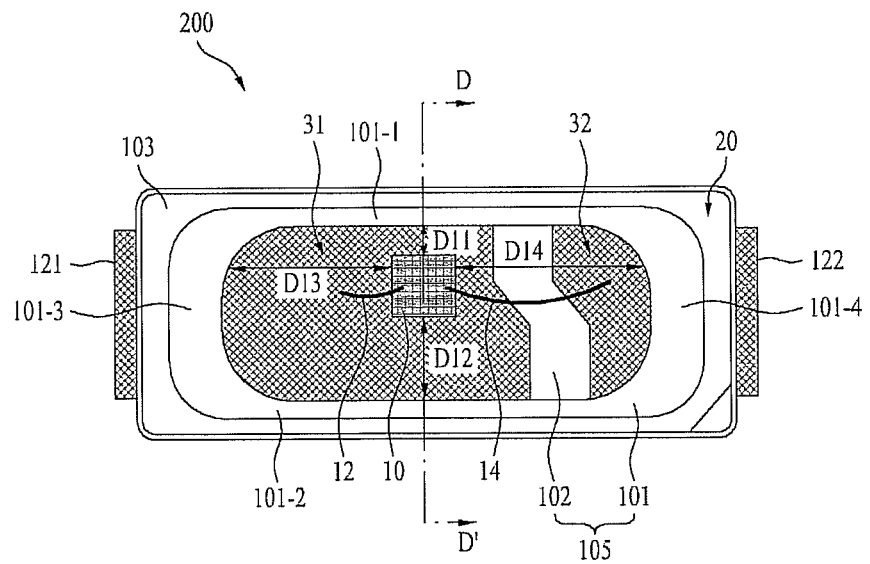
FIG. 10 illustrates a plan view of the light emitting device package in FIG. 9.
Figure 11:
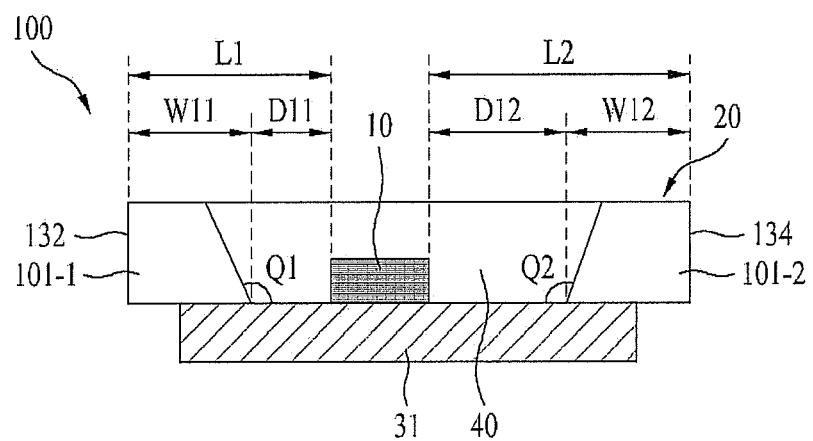
FIG. 11 illustrates a section of the light emitting device package in FIG. 9 across a line D-D'.

FIG. 9 illustrates a perspective view of a light emitting device package 200 in accordance with another embodiment, seen from above, FIG. 10 illustrates a plan view of the light emitting device package 200 in FIG. 9, and FIG. 11 illustrates a section of the light emitting device package 200 in FIG. 9 across a line D-D'. A bottom side view of the light emitting device package 200 illustrated in FIG. 9 may be the same with FIG. 2. Reference numerals the same with the ones in FIGS. 1 to 4 illustrate identical elements, and repetitive description therewith will be omitted or briefed.

Referring to FIGS. 9~11, the light emitting device package 200 includes a body 20, a first lead frame 31, a second lead frame 32, a light emitting device 10, a first wire 12, a second wire 14, and a resin layer 40.

A reflective sidewall 101 includes a plurality of side walls 101-1~101-4, wherein at least one of the side walls 101-1~101-4 may have a spaced distance to the light emitting device 10 different from the rest of the side walls.

Distances spaced from opposite side walls (For an example, 101-1 and 102-1) of the reflective sidewall 101 to the light emitting device 10 may be different from each other. That is, the light emitting device 10 may be disposed on the first lead frame 31 such that a first spaced distance D11 is different from a second spaced distance D12. The first spaced distance D11 may be a distance spaced apart from a first side wall 101-1 of the opposite side walls of the reflective sidewall 101 to the light emitting device 10. The second spaced distance D12 may be a distance spaced apart from the second side wall 101-2 of the opposite side walls of the reflective sidewall 101 to the light emitting device 10. For an example, the first spaced distance D11 may be smaller than the second spaced distance D12.

A thickness of one of the side walls may be the same with a thickness of the other one of the side walls, and the slope angle of one of the side walls may be the same with the slope angle of the other one of the side walls.

The first side wall 101-1 and the second side wall 101-2 may have thicknesses and slope angles symmetric to each other. That is, the thicknesses W11 and W12 and the slope angles θ1 and θ2 of the first side wall 101-1 and the second side wall 101-2 may be the same with each other, respectively.

And, a distance L1 from one side 132 of the body 20, for an example, from an outside surface 132 of the first side wall 101-1 to the light emitting device 10, may be different from a distance L2 from the other side surface 134 of the body 10, for an example, from the outside surface 134 of the second side wall 101-2 to the light emitting device 10 (L1≠L2), for an example, L1<L2.

Since the spaced distances D11 and D12 from the light emitting device 10 to the opposite reflective sidewalls 101 are different from each other, the light forwarding angle of the light emitting device package 100 may be asymmetric.

Figure 12:
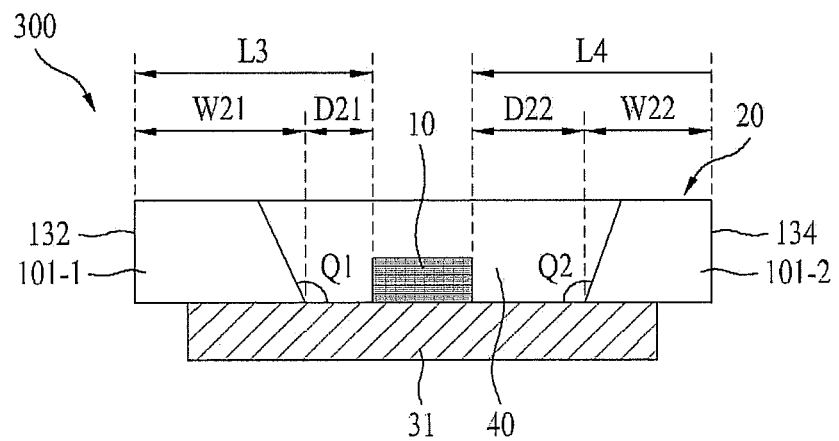
FIG. 12 illustrates a cross section of a light emitting device package in accordance with another embodiment.

FIG. 12 illustrates a cross section of a light emitting device package 300 in accordance with another embodiment. The embodiment illustrated in FIG. 12 may be a variation of the embodiment illustrated in FIG. 9.

Referring to FIG. 12, a distance from one outside surface of one of the side walls to the light emitting device 10 may be the same with a distance from the other outside surface to the light emitting device 10, and a thickness of one of the side walls may be different from a thickness of the other side wall.

The light emitting device 10 may be disposed on the first lead frame 31 such that, of the opposite side walls of the reflective sidewall 101, a first spaced distance D21 from the first side wall 101-1' to the light emitting device 10 may be different from the second spaced distance D22 from the second side wall 101-2 to the light emitting device 10.

A structural difference of the embodiment from the embodiment in FIG. 9 is as follow.

A distance L3 is the same with a distance L4(L3=L4). The distance L3 may be a distance spaced apart from one side 132 of the body 20, for an example, from the outside surface 132 of the first side wall 101-1' to the light emitting device 10.

The distance L4 may be a distance spaced apart from the other side 134 of the body 20, for an example, from the outside surface 134 of the second side wall 101-2 to the light emitting device 10.

The first side wall 101-1' has the thickness W21 different from the thickness W22 of the second side wall 101-2'. For an example, the thickness W21 of the first side wall 101-1' may be thicker than the thickness W22 of the second side wall 101-2'.

The light emitting device package 300 illustrated in FIG. 12 may also adjust the light forwarding angle, asymmetrically.

Figure 13:
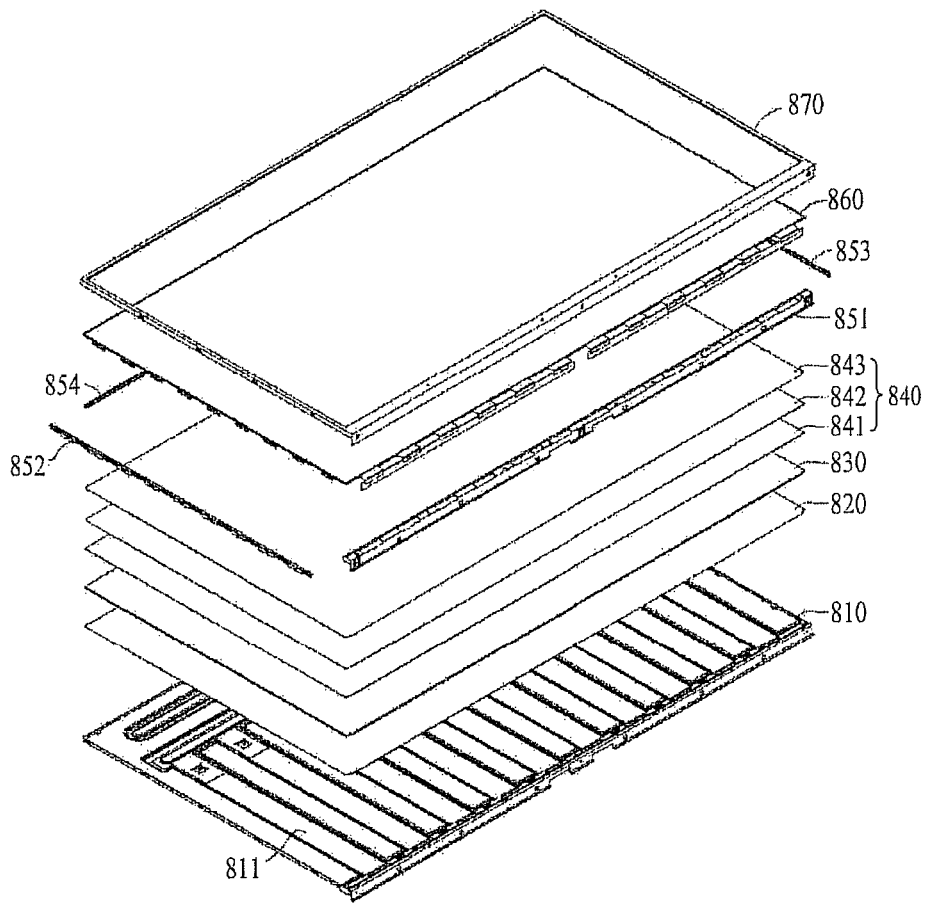
FIG. 13 illustrates an exploded perspective view of a display device having a light emitting device package in accordance with one embodiment.
Figure 14A:
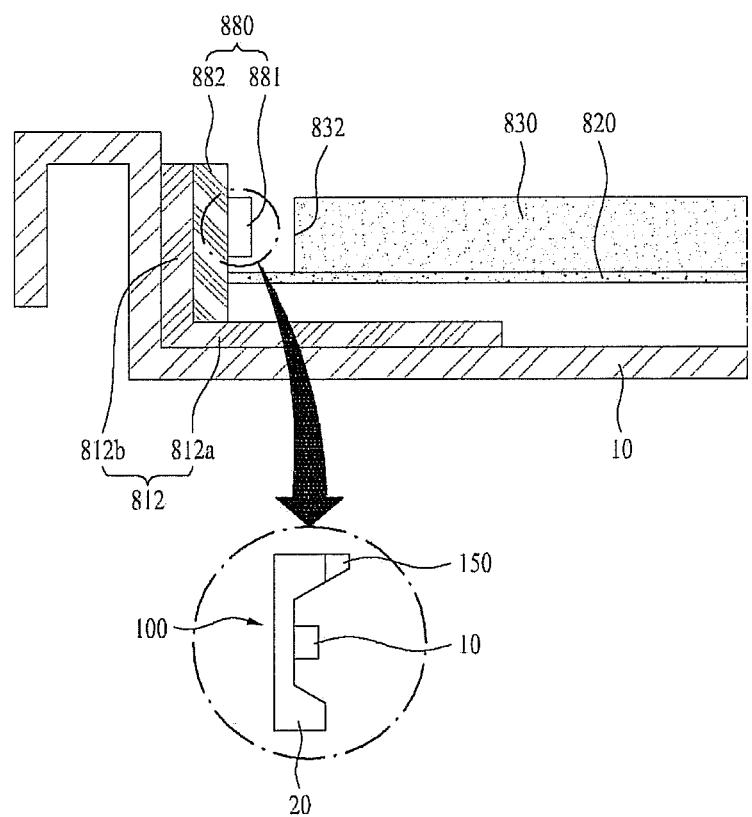
FIG. 14A illustrates a light source of the display device in FIG. 13 in accordance with a first embodiment of the present invention.

FIG. 13 illustrates an exploded perspective view of a display device having a light emitting device package in accordance with one embodiment, and FIG. 14A illustrates a light source of the display device in FIG. 13 in accordance with a first embodiment of the present invention.

Referring to FIGS. 13 and 14A, the display device includes a backlight unit, a liquid crystal display panel 860, a top cover 870, and a fastening member 850.

The backlight unit includes a bottom cover 810, a light emitting module 880 provided to one side of an inside of the bottom cover 810, a reflective plate 820 disposed on a front of the bottom cover 810, a light guide plate 830 in front of the reflective plate 820 for guiding a light from the light emitting module 880 toward a front of the display device, and an optical member 840 disposed in front of the light guide plate 830. The liquid crystal display panel 860 is disposed in front of the optical member 840, the top cover 870 is disposed in front of the liquid crystal display panel 860, and the fastening member 850 is disposed between the bottom cover 810 and the top cover 870 for fastening the bottom cover 810 and the top cover 870, together.

The light guide plate 830 serves to guide the light from the light emitting module 880 to be forwarded in a form from a surface light source, the reflective plate 820 in rear of the light guide plate 830 reflects the light from the light emitting module 880 toward the light guide plate 830 to improve luminous efficiency.

However, the reflective plate 820 may be an individual element as shown in the drawing, or may be a coat of a material of high reflectivity on a rear of the light guide plate 830, or on a front of the bottom cover 810. In this instance, the reflective plate 820 may be formed of a material which has a high reflectivity and can form a micron thickness, such as PET (PolyEthylene Terephtalate).

The light guide plate 830 scatters the light from the light emitting module 880 for uniform distribution of the light to an entire region of a screen of the liquid crystal display panel. Accordingly, the light guide plate 830 may be formed of a material having good refractivity and transmissivity, such as PMMA (PolyMethylMethAcrylate), PC (PolyCarbonate), or PE (PolyEthylene).

The optical member 840 on the light guide plate 830 diffuses the light from the light guide plate 830 at a predetermined angle. The optical member 840 makes the light guided by the light guide plate 830 to be directed toward the liquid crystal display panel 860, uniformly. The optical member 840 may be a selective stack of optical sheets, such as a diffusion sheet, and a prism sheet, or a protective sheet, or a microlens array. In this instance, a plurality of the optical sheets may be used, and the optical sheets may be formed of a transparent resin, such as acryl resin, polyurethane resin, a silicone resin. And, as described before, a fluorescent sheet may be included to the prism sheet.

The liquid crystal display panel 860 may be provided to the front of the optical member 840. In this instance, it is natural that, besides the liquid crystal display panel 860, different kinds of display devices which need a light source may be provided. The reflective plate 820 is placed on the bottom cover 810, and the light guide plate 830 is placed on the reflective plate 820. Accordingly, the reflective plate 820 may be in direct contact with a heat dissipation member (Not shown).

The light emitting module 880 includes a plurality of light emitting device packages 881 and a printed circuit board 882. The plurality of light emitting device packages 882 may be mounted on a line on the printed circuit board 882. The light emitting device package 881 may be the embodiment shown in FIG. 1.

The light emitting device packages 881 may be disposed on the printed circuit board 882 to face an incident surface 832 such that the protrusion 150 is parallel to a long side of the incident surface 832 of the light guide plate 830. That is, the light emitting device packages 881 may be disposed on the printed circuit board 882 to face the incident surface 832 such that the side walls 101-1 and 101-2 of the asymmetric reflective sidewall 101 are parallel to the long side of the incident surface 832 of the light guide plate 830. In this instance, the long side may be either one of the opposite sides having a relatively long length of the sides of the incident surface 832.

The printed circuit board 882 may be in contact with a bracket 812. In this instance, the bracket 812 may be formed of a material having good heat conductivity for heat dissipation in addition to the fastening, and though not shown, a thermal pad may be provided between the bracket 812 and the light emitting device packages 881 for making easy transmission of the heat. And, as shown, the bracket 812 of an 'L' shape has a width portion 812a supported on the bottom cover 810, and a length portion 812b having the printed circuit board 882 fastened thereto.

Figure 14B:
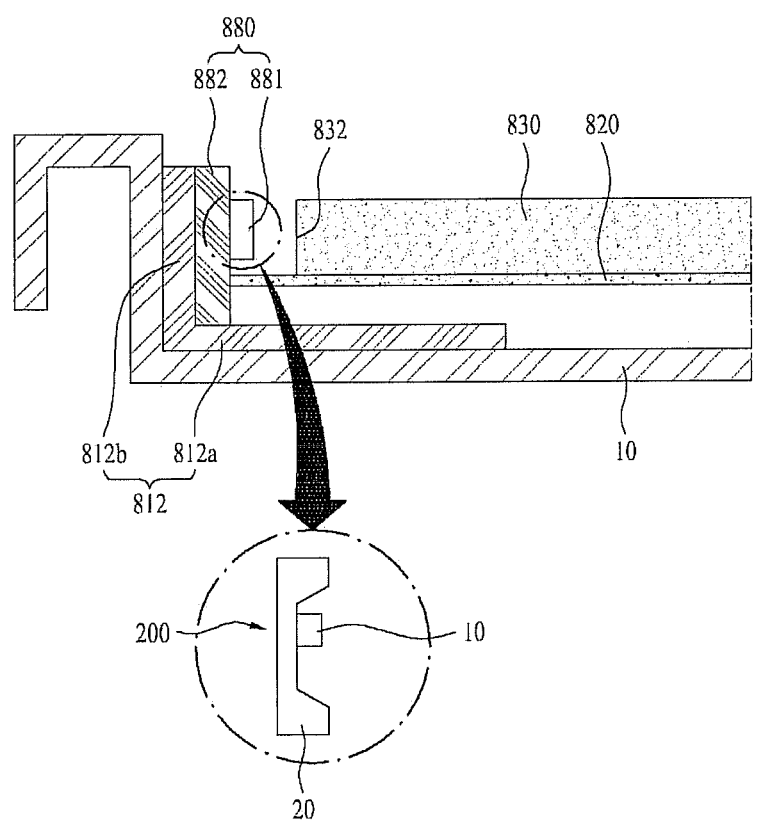
FIG. 14B illustrates a light source of the display device in FIG. 13 in accordance with a second embodiment of the present invention.

FIG. 14B illustrates a light source of the display device in FIG. 13 in accordance with a second embodiment of the present invention. As shown in FIG. 14B, each of the plurality of light emitting device packages 882 may be the light emitting device package 200 in FIG. 9. In this instance, the distances spaced apart from the opposite side walls 101-1 and 101-2 of the reflective sidewall 101 of the light emitting device package 200 to the light emitting device 10 are different from one another. The opposite side walls 101-1 and 101-2 may be parallel to the long side of the incident surface 832 of the light guide plate 830.

Figure 14C:
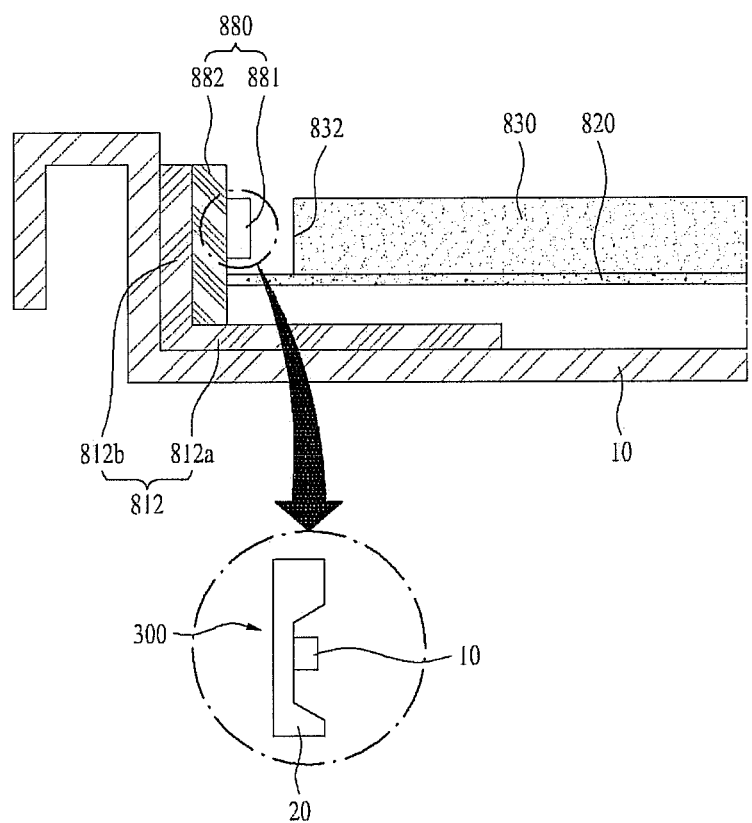
FIG. 14C illustrates a light source of the display device in FIG. 13 in accordance with a third embodiment of the present invention.

FIG. 14C illustrates a light source of the display device in FIG. 13 in accordance with a third embodiment of the present invention. Referring to FIG. 14C, the plurality of light emitting device packages 882 may be the light emitting device package 300 in FIG. 12.

Of the opposite side walls of the reflective sidewall 101 of the light emitting device package 300, the first spaced distance D21 spaced apart from the first side wall 101-1' to the light emitting device 10 is different from the second spaced distance D22 spaced apart from the second side wall 101-2' to the light emitting device 10. The distance L3 from the outside surface 132 of the first side wall 101-1' to the light emitting device 10 is the same with the distance L4 from the outside surface 134 of the second side wall 101-2 to the light emitting device 10. The thickness W21 of the first side wall 101-1' is different from the thickness W22 of the second side wall 101-2'. The opposite first side wall 101-1' and the second side wall 101-2' may be parallel to the long side of the incident surface 832 of the light guide plate 830.

In general, if the thickness of the light guide plate 830 becomes thinner for making a slim display device, since the light emitting device package in the display device is symmetric and has a fixed light forwarding angle, a quantity of the light incident on the light guide plate 830 having the thinner thickness may be reduced.

However, the embodiments illustrated in FIGS. 14A~14C include a light emitting device package having the asymmetric light forwarding angle, the light quantity loss can be reduced.

As has been described, the light emitting device and a display device therewith can make the light forwarding angle to be asymmetric.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device package comprising:
    a first lead frame and a second lead frame spaced from each other;
    a light emitting device disposed on the first lead frame; and
    a reflective sidewall disposed on the first lead frame and the second lead frame to surround the light emitting device,
    wherein a portion of the reflective sidewall has a different height from the other portion of the reflective sidewall, and the reflective sidewall has a protrusion from at least a portion of a region thereof.

2. The light emitting device package according to claim 1, wherein the reflective sidewall includes a plurality of side walls,
    wherein at least one of the side walls has at least one of a height or a slope angle different from the rest of the side walls.

3. The light emitting device package according to claim 1, wherein the reflective sidewall includes:
    a plurality of side walls, and
    a protrusion disposed on at least one of the side walls.

4. The light emitting device package according to claim 3, wherein the protrusion is disposed on one of long side walls of the plurality of the side walls.

5. The light emitting device package according to claim 3, wherein the protrusion is disposed on one of the long side walls and on a portion of each of short side walls adjacent to the one long side wall of the plurality of the side walls.

6. The light emitting device package according to claim 3, wherein the protrusion is formed as one unit with the reflective sidewall.

7. The light emitting device package according to claim 3, wherein the protrusion is formed of a reflective material different from the reflective sidewall.

8. The light emitting device package according to claim 3, wherein the protrusion has a height higher than the rest of the side walls.

9. The light emitting device package according to claim 5, wherein a first region is symmetry with a second region and the first region is one region of an upper side of the reflective sidewall that the protrusion is disposed on and the second region is the rest region of the upper side of the reflective sidewall.

10. The light emitting device package according to claim 3, wherein the protrusion is a light forwarding angle adjusting portion for adjusting a light forwarding angle according to a thickness and a slope angle thereof.

11. A light emitting device package comprising:
a first lead frame and a second lead frame spaced from each other;
a light emitting device disposed on the first lead frame; and
a reflective sidewall having a plurality of side walls disposed around the first lead frame and the second lead frame,
wherein a spaced distance spaced apart from at least one of the side walls to the light emitting device is different from a spaced distance spaced from the rest of the side walls to the light emitting device.

12. The light emitting device package according to claim 11, wherein one of the side walls has a thickness the same with a thickness of the other one.

13. The light emitting device package according to claim 11, wherein one of the side walls has a slope angle the same with the other one.

14. The light emitting device package according to claim 11, wherein one of the side walls has a distance from an outside surface thereof to the light emitting device different from a distance from an outside surface of the other one of the side walls to the light emitting device.

15. The light emitting device package according to claim 11, wherein one of the side walls has a distance from an outside surface thereof to the light emitting device the same with a distance from an outside surface of the other one of the side walls to the light emitting device.

16. The light emitting device package according to claim 15, wherein one of the side walls has a thickness different from a thickness of the other one.

17. A display device comprising:
a bottom cover;
a substrate and a light emitting module including a light emitting device package disposed on the substrate;
a reflective plate disposed in front of the bottom cover;
a light guide plate disposed in front of the reflective plate for guiding a light from the light emitting module;
an optical member disposed in front of the light guide plate; and
a liquid crystal display panel disposed in front of the optical member,
wherein the light emitting device package includes:
a first lead frame and a second lead frame disposed spaced from each other,
a light emitting device disposed on the first lead frame, and
a reflective sidewall disposed on the first lead frame and the second lead frame to surround the light emitting device,
wherein a portion of the reflective sidewall has a different height from the other portion of the reflective sidewall, and the reflective sidewall has a protrusion from at least a portion of a region thereof.

18. The display device according to claim 17, wherein the reflective sidewall includes:
a plurality of side walls, and
a protrusion disposed on at least one of the side walls.

19. The display device according to 18, wherein the protrusion is disposed on the substrate parallel to an incident surface of the light guide plate.

* * * * *